(12) United States Patent
Deng et al.

(10) Patent No.: US 10,265,821 B2
(45) Date of Patent: Apr. 23, 2019

(54) AUTOMATIC COMPONENT LOADING SYSTEM

(71) Applicants: Tyco Electronics (Shanghai) Co. Ltd., Shanghai (CN); Tyco Electronics (Shenzhen) Co. Ltd, Shenzhen (CN); Shenzhen AMI Technology Co., Ltd, Shenzhen (CN)

(72) Inventors: Yingcong Deng, Shanghai (CN); Dandan Zhang, Shanghai (CN); Roberto Francisco-Yi Lu, Shanghai (CN); Yaodong Wu, Shanghai (CN); Zhenliang Chen, Shanghai (CN); Zhao Li, Shanghai (CN); Jin Su, Shanghai (CN); Zhi Li, Shanghai (CN); Qinglong Zeng, Shanghai (CN)

(73) Assignees: Tyco Electronics (Shanghai) Co. Ltd., Shanghai (CN); Tyco Electronics (Shenzhen) Co. Ltd., Shenzhen (CN); Shenzhen AMI Technology Co., Ltd, Shenzhen (CN)

( * ) Notice: Subject to any disclaimer, the term of this patent is extended or adjusted under 35 U.S.C. 154(b) by 268 days.

(21) Appl. No.: 14/928,224

(22) Filed: Oct. 30, 2015

(65) Prior Publication Data
US 2016/0128243 A1    May 5, 2016

(30) Foreign Application Priority Data

Oct. 31, 2014    (CN) .......................... 2014 1 0607066

(51) Int. Cl.
*B23Q 16/06*    (2006.01)
*B65G 47/90*    (2006.01)
(Continued)

(52) U.S. Cl.
CPC .......... *B23Q 16/06* (2013.01); *B23Q 7/1426* (2013.01); *H05K 13/021* (2013.01)

(58) Field of Classification Search
CPC ....... B23P 21/006; B23Q 5/20; B23Q 16/025; B23Q 16/06; B23Q 16/065; B23Q 2003/15586; B23Q 2220/002; B23Q 2220/004; B25J 9/023; B25J 9/026; B65G 47/80; B65G 47/901; B65G 47/902;
(Continued)

(56) References Cited

U.S. PATENT DOCUMENTS

| | | | |
|---|---|---|---|
| 3,688,363 A * | 9/1972 | Thobroe .............. | B23Q 1/5468 29/38 A |
| 2005/0024996 A1* | 2/2005 | Schumacher .......... | G11B 17/26 369/30.33 |
| 2015/0228509 A1* | 8/2015 | Hosek .................. | H02K 57/006 414/744.5 |

OTHER PUBLICATIONS

Chinese Patent Office, CN_201410607066.7 First Office Acton, dated Mar. 31, 2016 (Year: 2016).*
(Continued)

*Primary Examiner* — Saul Rodriguez
*Assistant Examiner* — Brendan P Tighe
(74) *Attorney, Agent, or Firm* — Barley Snyder (57) ABSTRACT

An automatic component loading system is disclosed. The automatic component loading system has a loading device, a conveying device having a plurality of first pin receiving slots and a plurality of first component receiving trays positioned around a circumference of the conveying device, and a position correcting device having at least one pin that corresponds with the plurality of first pin receiving slots.

12 Claims, 8 Drawing Sheets

(51) Int. Cl.
*B23Q 7/14* (2006.01)
*H05K 13/02* (2006.01)

(58) Field of Classification Search
CPC ............ Y10T 29/5127; Y10T 29/5128; Y10T 29/5129; Y10T 29/513; Y10T 29/5132; Y10T 29/5133; Y10T 29/5165; Y10T 29/5167; Y10T 74/1418; Y10T 74/1424; Y10T 74/1494; B23B 29/323; G11B 17/26
USPC .......... 72/405.03; 74/813 L, 816; 198/346.2, 198/378, 459.2, 478.1, 481.1, 605, 793, 198/832.1; 414/331.02, 331.05, 751.1
See application file for complete search history.

(56) References Cited

OTHER PUBLICATIONS

European Patent Office, EP_15192299.4 Written Opinion, dated Jul. 4, 2017 (Year: 2017).*

* cited by examiner

AUTOMATIC COMPONENT LOADING SYSTEM

CROSS-REFERENCE TO RELATED APPLICATIONS

This application claims the benefit of Chinese Patent Application No. 201410607066.7 filed on Oct. 31, 2014 in the State Intellectual Property Office of China, the whole disclosure of which is incorporated herein by reference.

FIELD OF THE INVENTION

The invention relates to an automatic component loading system, and more particularly, to an automatic component loading system capable of transmitting a tray, on which components are loaded, to a predetermined position.

BACKGROUND

Generally, electrical equipment, such as an electrical connector, a fiber optic connector, a relay, etc., comprises many components, for example, a housing, a contact, a spring, a bolt, an insulation member, or the like. During production of such electrical equipment, a set of components with different shapes and functions are required to be prepared in advance and loaded on a first component receiving tray. Then, a loading device picks up the respective components from the first component receiving tray based on a preset program and places the picked components on a second tray located on a conveying device. The conveying device then transmits the second tray to a predetermined position. A robot selects these components from the second tray and assembles these components into the electrical equipment on an operation stage based on a preset program.

In general, the robot selects the required components from the second tray when the second tray is located at a fixed, predetermined position. Thereby, the position accuracy of the second tray will affect the efficiency of the robot to obtain and assemble the respective components.

SUMMARY

An object of the present invention is to ensure that a tray on which components are loaded is accurately positioned at its loading position to improve assembly efficiency. The disclosed automatic component loading system has a loading device, a conveying device having a plurality of first pin receiving slots and a plurality of first component receiving trays positioned around a circumference of the conveying device, and a position correcting device having at least one pin that corresponds with the plurality of first pin receiving slots.

BRIEF DESCRIPTION OF THE DRAWINGS

The invention will now be described by way of example with reference to the accompanying Figures, of which.

DETAILED DESCRIPTION OF THE EMBODIMENT(S)

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiments set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 1:
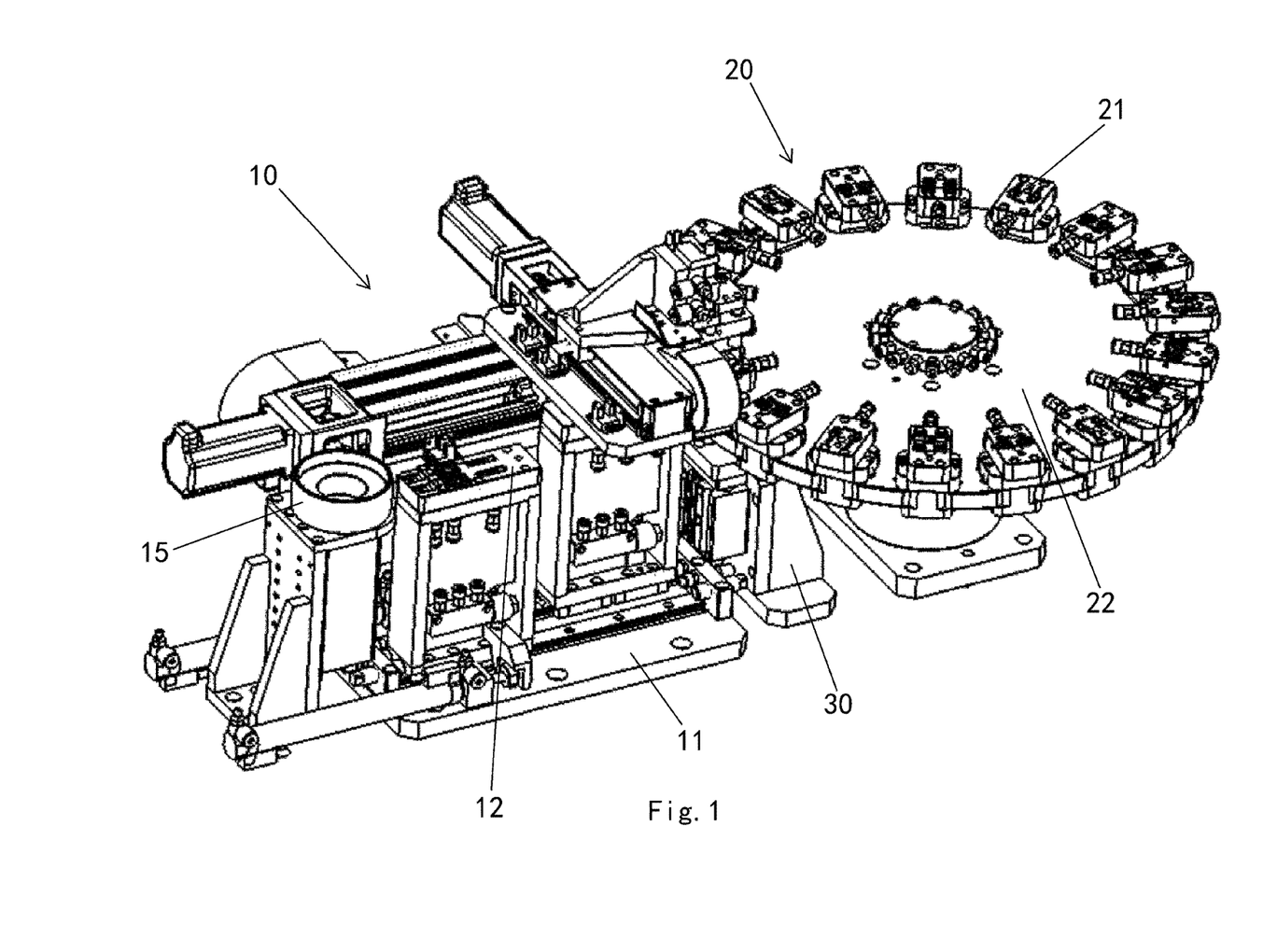
FIG. 1 is a perspective view of an automatic component loading system according to the invention.
Figure 2:
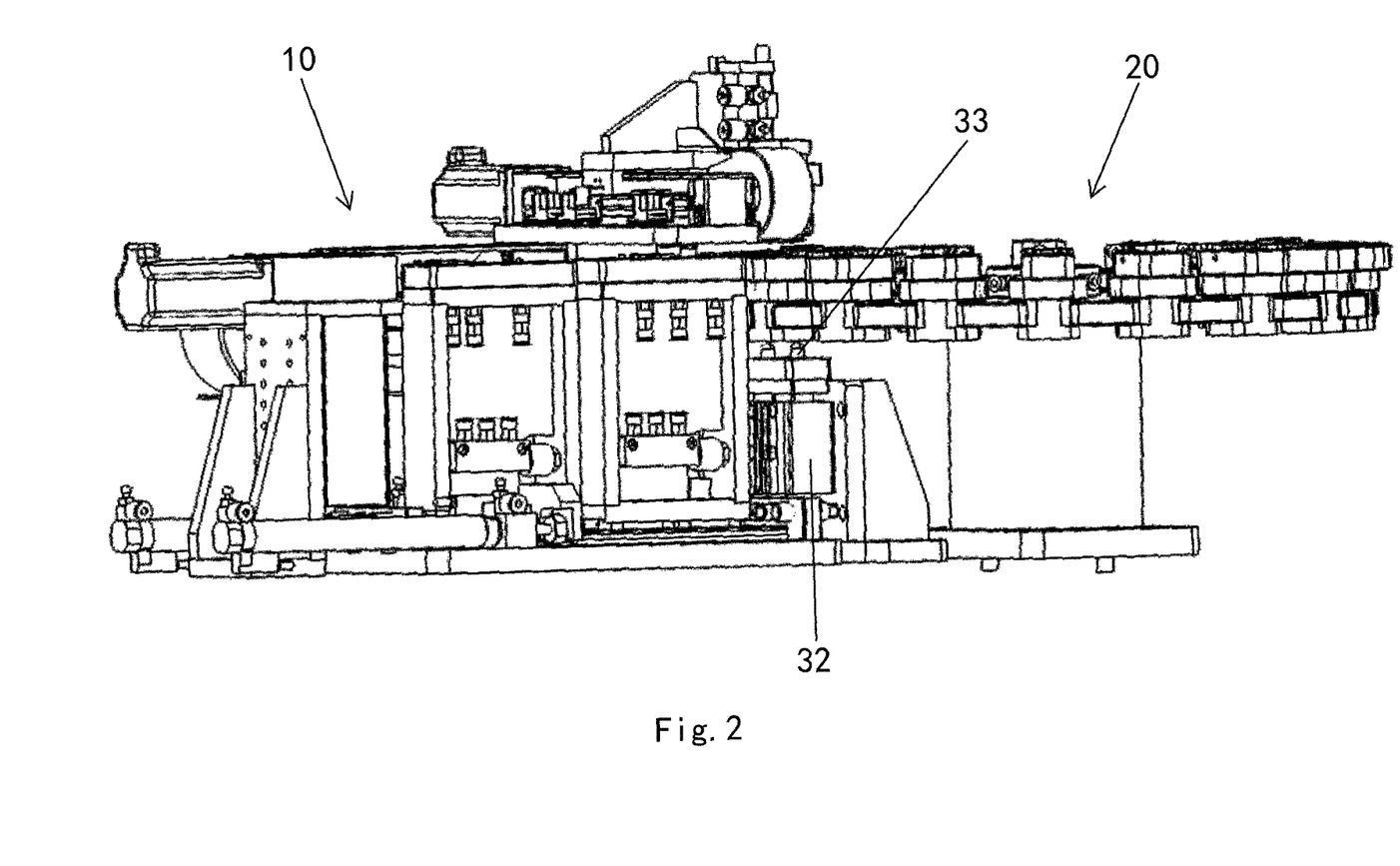
FIG. 2 is a side view of the automatic component loading system of FIG. 1.

As shown in FIGS. 1 and 2, an automatic component loading system comprises a loading device 10, a conveying device 20, a position correcting device 30, a first robot, and a second robot 40. The major components will now be described in more detail.

Figure 4:
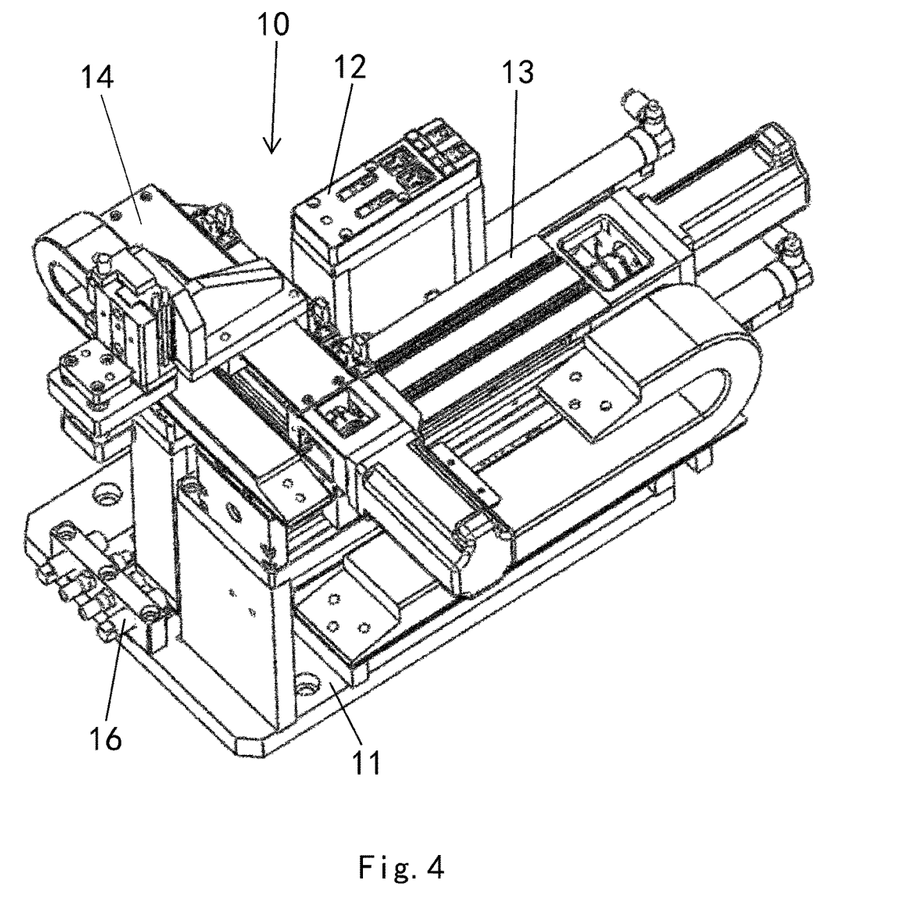
FIG. 4 is a perspective view of a loading device according to the invention.

The loading device 10, shown in FIG. 4, comprises a second base 11, a second tray 12, a reciprocating device 13 and a picking device 14. The second tray 12 and the reciprocating device 13 are both mounted on the second base 11. The reciprocating device 13 may comprise any one of rail moving device, belt transmitting device and roll transmitting device. The picking device 14 is movably mounted on the reciprocating device 13; the reciprocating device 13 may be constructed to bring the picking device 14 to reciprocate under the control of a controlling device (not shown). In an exemplary embodiment, as shown in FIG. 1, the loading device 10 further comprises a storage device 15.

Figure 3:
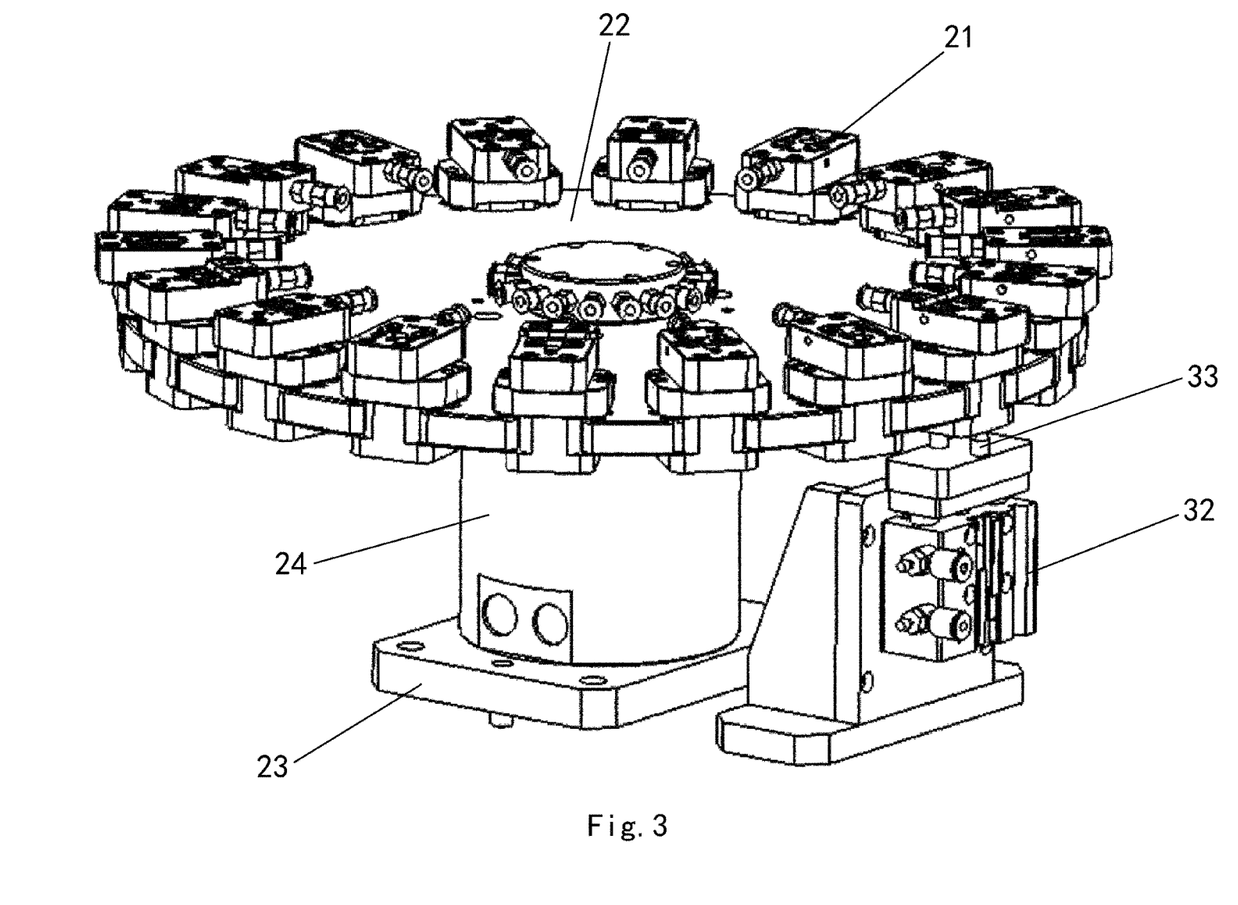
FIG. 3 is a perspective view of a conveying device and a position correcting device according to the invention.

As shown in FIGS. 1-3, the conveying device 20 comprises a turntable 22 that is rotatable in a horizontal plane. A plurality of first component receiving trays 21 are arranged on peripheral edge of the turntable 22 by a regular interval. The conveying device 20 further comprises a first base 23 and a motor 24 mounted on the first base 23. The motor 24 is configured to drive the turntable 22 to rotate. In this way, when the turntable 22 is rotated by the motor 24, the plurality of first component receiving trays 21 each is circularly moved. Although the conveying device 20 is described as the turntable 22, the present invention is not limited to this. In an alternative embodiment, the conveying device may comprise any suitable linear conveying device, such as, belt conveyor, chain conveyor, etc.

Figure 6:
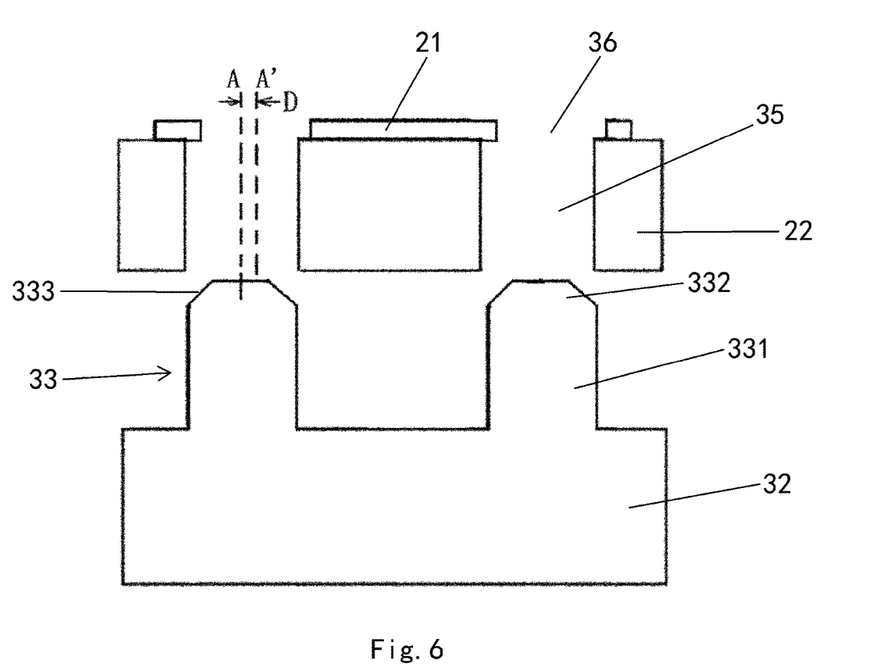
FIG. 6 is a side view showing a tray and a driving device of an automatic component loading system according to the invention.

The position correcting device 30, as shown in FIG. 6, includes a first correcting mechanism comprising at least one first slot 35 passing through the turntable 22 and at least one second slot 36 extending upwardly from a bottom surface of the first component receiving tray 21 and aligning with the respective first slot 35. The position correcting device 30 also includes a second correcting mechanism comprising at least one pin 33 and a driving device 32. The at least one pin 33 each is configured to be mated with the respective second slot 36. At least one of the pin 33 and the second slot 36 mated with each other has a sloped contact surface 333. The driving device 32 is configured to drive the at least one pin 33 into the respective second slot 36. In an exemplary embodiment of the present invention, the driving device 32 may comprise a motor, an electromagnetic clutch mechanism, or a pneumatic drive device, but the present invention is not limited to this, the driving device 32 may be any suitable device as long as it may insert the pin into the slot. The position correcting device 30 may also comprise a position sensor (not shown).

Figure 7:
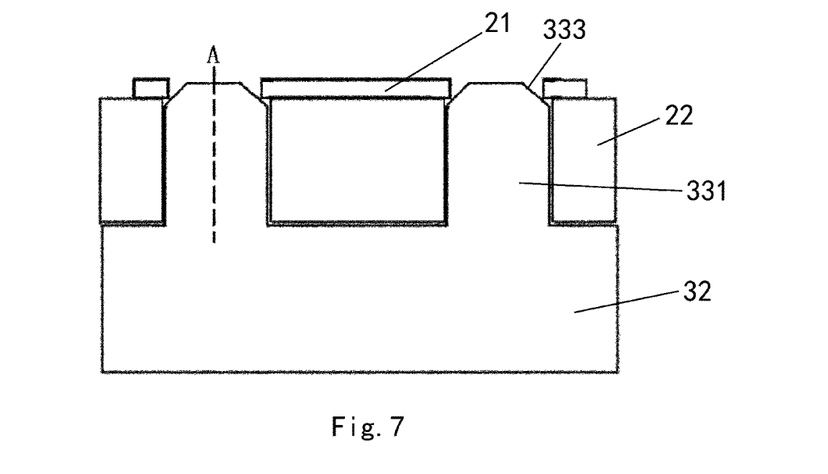
FIG. 7 is a side view showing the tray and driving device of FIG. 6.

In an embodiment, as shown in FIGS. 6 and 7, the first slot 35 substantially exhibits a cylindrical shape or a truncated cone shape, and the second slot 36 substantially exhibits a cylindrical shape. The pin 33 comprises a cylindrical portion 331 mated with the second slot 35 and a cone shape or truncated cone portion 332 located at one end of the cylindrical part 331 and mated with the first slot 36. The above mentioned contact surface is formed on the truncated cone portion 332.

The plurality of first correcting mechanisms, slots 35 and 36, are mounted on a lower portion of the turntable 22 and correspond to the loading position of the first component receiving trays 21. The second correcting mechanism, including the pin 33 and driving device 32, is fixed to the second base 11 by screwing bolts 16 provided on the second base 11 into thread holes (not shown) formed in the second correcting mechanism. The second correcting mechanism thus may be fixedly provided relative to the turntable 22.

Figure 5:
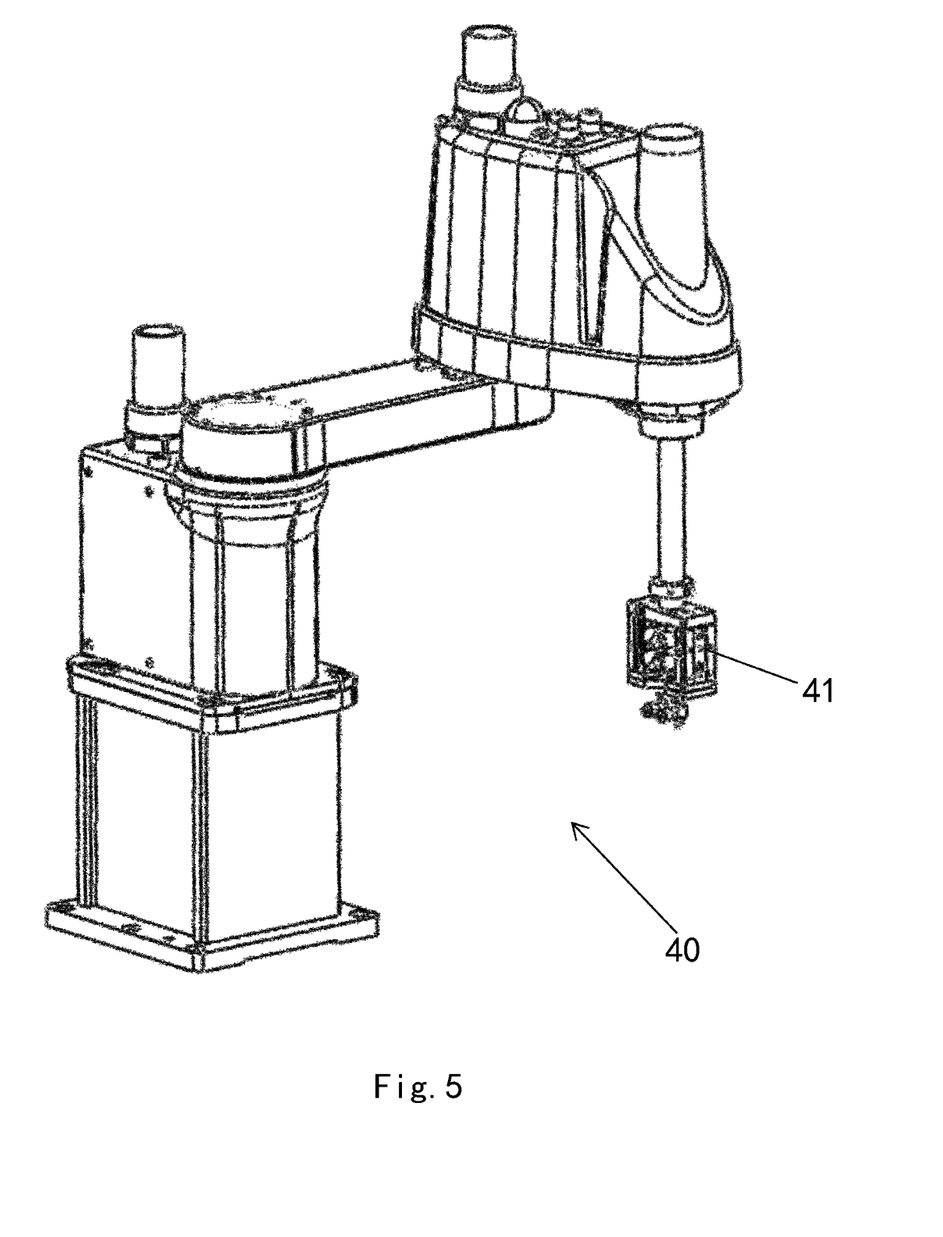
FIG. 5 is a perspective view of a robot according to the invention.

The automatic component loading system further comprises a first robot (not shown) and a second robot 40. The second robot 40, shown in FIG. 5, comprises a plurality of grippers 41 configured to pick up various components with different shapes. The first robot and the second robot may comprise but are not limited to a four-axis robot, a six-axis robot or any other suitable multi-freedom robot. These robots may control the grippers 41 to grip respective components based on preset program implemented on a processor (not shown). The gripper 41 may comprise a large sucker configured to grip a conductive terminal, a small sucker configured to grip a wire, and a plurality of arms configured to a large component, for example, a housing of a connector. There may be provided one or more different types of grippers mounted on the robot as necessary.

An operation of the automatic component loading system will now be described.

The first robot transfers the components from the storage device 15 to the second tray 12, and, by reciprocating the picking device 14 on the reciprocating device 13, the loading device 10 is configured to pick up respective components based on a preset program implemented on a processor (not shown).

The conveying device 20 is provided with a plurality of first component receiving trays 21 for receiving the components. The conveying device is configured so that the plurality of first component receiving trays 21 each is circularly moved between a loading position and an unloading position to allow the loading device 10 load the picked components on the first component receiving tray 21 at the loading position, by reciprocating the picking device 14 on the reciprocating device 13, and the second robot 40 may grip the components from the first component receiving tray 21 at the unloading position based on a preset program implemented on a processor (not shown), so that the gripped components may be assembled into an electrical equipment on an operation stage by the robot in subsequent operation steps. The position correcting device 30 is configured to drive the conveying device 20 to move in a case where each first component receiving trays 21 deviates from its loading position, so as to accurately position the first component receiving tray 21 at the respective loading position thereof.

The automatic component loading system according to the embodiments of the present invention may be used to assemble other products having many tiny components simply by updating the control program implemented on a processor (not shown). Therefore, the automatic component loading system of the present invention has a wide universality.

As shown in FIGS. 3, 6 and 7, in an embodiment, the components on the first component receiving tray 21 are taken away by, for example, a robot, at the unloading position and the empty first component receiving tray 21 is returned to the loading position. As a result of this process, the position of the first component receiving tray 21 may be deviated relative to the turntable 22. As a result, for example, as shown in FIG. 6, the first component receiving tray 21 returned to the loading position is not accurately located at its ideal loading position A, but at an actual position A' deviated from its ideal loading position A by a deviation distance D.

In a case where each first component receiving tray 21 deviates from its loading position, the second correcting mechanism drives the turntable 22 or the first component receiving tray 21 to move by cooperating with one corresponding first correction mechanisms, so as to position the first component receiving tray at the respective loading positions thereof.

In an embodiment, for example, if the turntable 22 is provided with eighteen first component receiving trays 21 thereon, then one of the eighteen first component receiving trays 21 is moved to its loading position every time when the turntable is rotated by 20 degrees. At this time, the driving device 32 is automatically activated, so as to drive the pin 33 to insert into the respective first slot 35. As shown in FIG. 6, if the first component receiving tray 21 on the turntable 22 is located at a position A' deviated from its ideal loading position A, the sloped contact surface 333 of the truncated cone portion 332 comes into contact with an edge of the second slot 36 during inserting the pin 33, so as to drive the first component receiving tray 21 to its ideal loading position A, as shown in FIG. 7. After the first component receiving tray 21 is moved to its ideal loading position A, the loading device 10 may accurately place the components on the first component receiving tray 21.

In an embodiment, the position sensor (not shown) is alternatively configured to detect a deviation of the first component receiving tray 21 from its loading position. If the deviation of the first component receiving tray 21 from its loading position detected by the position sensor goes beyond a predetermined range, the driving device 32 is activated to drive the at least one pin 33 into the respective second slot 36 through the respective first slot 35.

In the above described embodiment, two first slots 35, two second slots 36 and two pins 33 are provided. But the present invention is not limited to this, for example, one, three or more slots and pins may be provided. If two or more first and second slots are provided, these first and second slots may be arranged in a radial direction of the turntable 22 and the first component receiving tray 21 or in a circumferential direction of the turntable 22 and the first component receiving tray 21. It should be appreciated that the deviation of the first component receiving tray relative to the turntable 22 in the circumferential direction and the deviation of the first component receiving tray in the radial direction both may be corrected by mating the pin with the second slot. In an exemplary embodiment of the present invention, the position correcting device 30 drives the first component receiving tray 21 to move within a range less than 0.01 mm. That is, as long as the deviation of the first component receiving tray 21 from its ideal loading position is less than 0.01 mm, it may be corrected by the position correcting device 30.

The position correcting device shown in FIGS. 6 and 7 may be constructed to correct the position of the first component receiving tray 21 as described above when the first component receiving tray 21 is deviated relative to the turntable 22. It should be appreciated that the position correcting device may correct the positions of the turntable 22 and the first component receiving tray 21 at the same time when the turntable 22 and the first component receiving tray 21 both are deviated from ideal positions thereof.

Figure 8:
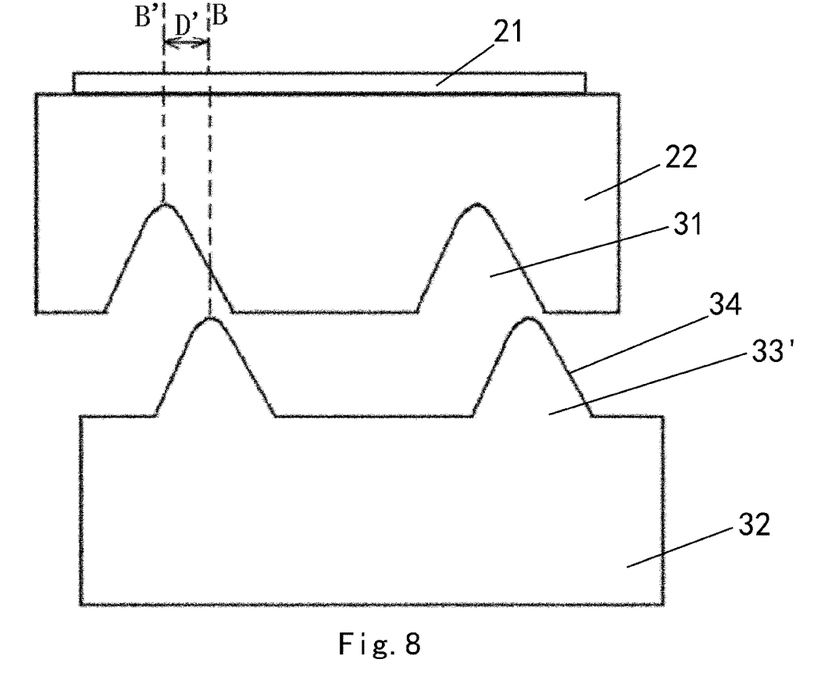
FIG. 8 is a side view showing a turntable and a driving device of an automatic component loading system according to the invention.
Figure 9:
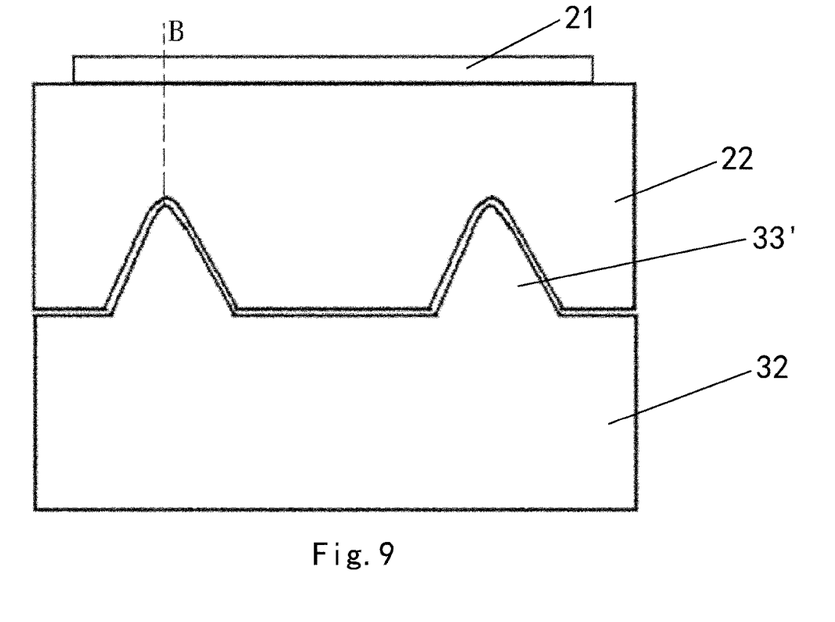
FIG. 9 is a side view showing the turntable and driving device of FIG. 8.

In another embodiment, as shown in FIGS. 8 and 9, the first correcting mechanisms each comprises two slots 31 extending upwardly from a bottom surface of the turntable 21. Correspondingly, the second correcting mechanism comprises two pins 33' and a driving device 32. The two pins 33' each is configured to be mated with the respective slot 31. At least one of the pin 33' and the slot 31 mated with each other has a sloped contact surface 34. The driving device 32 is configured to drive two pins 33' into the respective slot 31, so as to drive the turntable 22 to rotate by means of the contact surface 34 in a case where each first component receiving trays 21 deviates from its ideal loading position A.

In an embodiment, for example, if the turntable 22 is provided with eighteen first component receiving trays 21 thereon, then one of the eighteen first component receiving trays 21 is moved to its loading position every time when the turntable 22 is rotated by 20 degrees. At this time, the driving device 32 is automatically activated, so as to drive the pin 33' to insert into the respective first slot 31. As shown in FIG. 8, in a case where the first component receiving tray 21 is fixed relative to the turntable 22 and where the turntable 22 is deviated, if the first component receiving tray 21 on the turntable 22 is located at a position B' deviated from its ideal loading position B, the sloped contact surface 34 of the pin 33' comes into contact with an edge of the slot 31 during inserting the pin 33' into the slot 31, so as to drive the turntable 22 to rotate, and move the first component receiving tray 21 to its ideal loading position B, as shown in FIG. 9. After the first component receiving tray 21 is moved to its ideal loading position B, the loading device 10 may accurately place the components on the first component receiving tray 21.

In the above described embodiment, two slots 31 and two pins 33' are provided. But the present invention is not limited to this, for example, one, three or more slots and pins may be provided. If two or more slots are provided, these slots may be arranged in a radial direction of the turntable 22 or in a circumferential direction of the turntable 22. It should be appreciated that the deviations of the first component receiving tray in the circumferential direction and in the radial direction both may be corrected by mating the pin with the slot. In an exemplary embodiment of the present invention, the position correcting device 30 drives the turntable 22 to rotate, so as to move the first component receiving tray 21 within a range less than 0.01 mm. That is, as long as the deviation of the first component receiving tray 21 from its ideal loading position is less than 0.01 mm, it may be corrected by the position correcting device 30.

Figure 10:
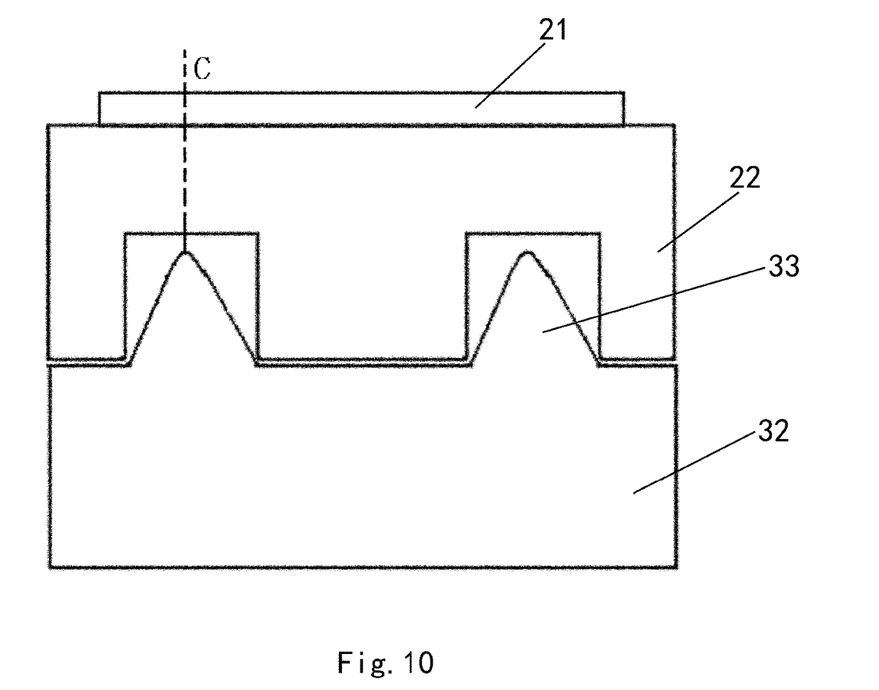
FIG. 10 is a side view showing a turntable and a driving device of an automatic component loading system according to the invention.

In an exemplary embodiment shown in FIGS. 8 and 9, the slot 31 and the pin 33' both substantially exhibit a cone shape. In an alternative embodiment, as shown in FIG. 10, the slot substantially exhibits a cylindrical shape, and the pin 33 substantially exhibits a cone shape. With the configuration shown in FIG. 10, when the turntable 22 is stopped at the loading position, if the first component receiving tray 21 on the turntable 22 is deviated from its ideal loading position C, the sloped contact surface of the pin 33 becomes into contact with an edge of the slot during inserting the pin 33 into the slot, so as to drive the turntable 22 to rotate, and move the first component receiving tray 21 to its ideal loading position C.

Advantageously, the automatic component loading system as described above may repeatedly position the first component receiving tray and/or the turntable, so that operations of loading and unloading the components are repeated in consistence, ensuring that the first component receiving tray, on which the components to be loaded, is accurately and efficiently positioned at its ideal loading position. In this way, the components may be loaded on respective locations on the first component receiving tray, facilitating a subsequent operation of automatically gripping the components, and improving the quality and efficiency of manufacturing/assembling the electrical equipment. During the position correction, repeatedly positioning of the first component receiving tray or the turntable may be achieved without using a position control device, such as, a position sensor, a controller and the like, decreasing the cost of the electrical equipment, and reducing the cycle operation time of loading and unloading the components. The automatic component loading system according to embodiments of the present invention may be served as an intermediate module for loading and unloading the components in high precision during manufacturing the electronic equipment.

What is claimed is:
1. An automatic component loading system, comprising:
a loading device;
a conveying device having a rotating turntable, a plurality of first pin receiving slots extending through the turntable, and a plurality of first component receiving trays positioned around a circumference of the turntable by a regular interval, the plurality of first component receiving trays separated by a plurality of second pin receiving slots; and
a position correcting device having at least one pin that extends through one of the plurality of first pin receiving slots and into one of the plurality of second pin receiving slots, the portion of the pin extending into the second pin receiving slot abuts at least one first component receiving tray and moves the first component receiving tray with respect to the turntable into a loading position aligning the first component receiving tray with the loading device.
2. The automatic component loading system according to claim 1, wherein the plurality of second pin receiving slots correspond to the plurality of first pin receiving slots.

3. The automatic component loading system according to claim 2, wherein the position correcting device further comprises a driving device, the driving device positioning the at least one pin such that the pin extends into the first and second pin receiving slots.

4. The automatic component loading system according to claim 1, wherein the portion of the pin extending into the second pin receiving slot engages with the turntable such that the turntable is in a predetermined position.

5. The automatic component loading system according to claim 4, wherein the first pin receiving slot is either a cylindrical shape or a truncated cone shape, and the second pin receiving slot is a cylindrical shape.

6. The automatic component loading system according to claim 5, wherein the portion of the pin extending into the first pin receiving slot is a cylindrical shape, and the portion of the pin extending into the second pin receiving slot is a truncated cone shape.

7. The automatic component loading system according to claim 1, wherein the position correcting device further comprises a position sensor.

8. The automatic component loading system according to claim 1, wherein the loading device comprises a base, a second tray and a rail mounted on the base, and a picking device movable along the rail.

9. The automatic component loading system according to claim 8, wherein the loading device further comprises a storage device storing a plurality of components, and a first robot moves components from the storage device to the second tray.

10. The automatic component loading system according to claim 9, wherein the picking device moves a component from the second tray to a first component receiving tray.

11. The automatic component loading system according to claim 10, further comprising a second robot removing the components from the first component receiving tray at an unloading position of the first component receiving tray.

12. The automatic component loading system according to claim 1, wherein each of the second pin receiving slots is aligned with one of the first pin receiving slots in a direction extending perpendicular to a surface of the turntable on which the first component receiving trays are positioned.

* * * * *